US 9,071,245 B2

(12) United States Patent
Rozman et al.

(10) Patent No.: US 9,071,245 B2
(45) Date of Patent: Jun. 30, 2015

(54) SOLID STATE POWER CONTROLLER GATE CONTROL

(71) Applicant: HAMILTON SUNDSTRAND CORPORATION, Windsor Locks, CT (US)

(72) Inventors: Gregory I. Rozman, Rockford, IL (US); Steven J. Moss, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 13/869,516

(22) Filed: Apr. 24, 2013

(65) Prior Publication Data

US 2014/0320194 A1    Oct. 30, 2014

(51) Int. Cl.
H03K 3/00      (2006.01)
H03K 17/16     (2006.01)

(52) U.S. Cl.
CPC .................................. H03K 17/167 (2013.01)

(58) Field of Classification Search
USPC .................................................. 327/108, 109
See application file for complete search history.

(56) References Cited

U.S. PATENT DOCUMENTS

| 4,721,869 | A  | * | 1/1988  | Okado         | 326/14  |
|-----------|----|---|---------|---------------|---------|
| 5,504,449 | A  | * | 4/1996  | Prentice      | 327/427 |
| 5,742,193 | A  | * | 4/1998  | Colli et al.  | 327/170 |
| 5,852,538 | A  | * | 12/1998 | Masui         | 361/18  |
| 5,963,078 | A  | * | 10/1999 | Wallace       | 327/432 |
| 6,998,911 | B2 | * | 2/2006  | Honda et al.  | 330/10  |
| 7,564,147 | B2 |   | 7/2009  | Michalko      |         |
| 8,390,151 | B2 |   | 3/2013  | Rozman et al. |         |
| 8,519,686 | B2 |   | 8/2013  | Rozman et al. |         |
| 8,536,730 | B2 |   | 9/2013  | Rozman et al. |         |
| 8,553,373 | B2 |   | 10/2013 | Rozman et al. |         |
| 8,618,847 | B2 | * | 12/2013 | Brumett et al.| 327/109 |
| 8,625,243 | B2 |   | 1/2014  | Rozman et al. |         |
| 8,699,251 | B2 |   | 4/2014  | Rozman et al. |         |
| 2005/0151585 | A1 | * | 7/2005 | Honda et al. | 330/10 |
| 2012/0007103 | A1 | * | 1/2012 | Domeij       | 257/77 |
| 2012/0019287 | A1 | * | 1/2012 | Brumett et al. | 327/109 |

(Continued)

FOREIGN PATENT DOCUMENTS

EP     1928090 A2    6/2008
GB     2488778 A     9/2012

OTHER PUBLICATIONS

C.Gerster,P.Hofer, "Gate-controlled dv/dt- and di/dt- limitation in high power IGBT converters", EPE Journal, vol. 5, No. 3/4, Jan. 1996, pp. 11-16, Swiss Federal Institute of Technology, Switzerland.

(Continued)

Primary Examiner — Ryan Jager
(74) Attorney, Agent, or Firm — Cantor Colburn LLP

(57) ABSTRACT

A system for controlling gate power includes a metal oxide semiconductor field effect transistor (MOSFET) configured to supply power to a load according to a gate control voltage applied to a gate of the MOSFET. The system includes a gate control circuit configured to turn on and off the gate control voltage supplied to the gate of the MOSFET. The system also includes a ramping circuit configured to perform at least one of ramping up a voltage applied to the gate of the MOSFET based on the gate control circuit turning on power to the gate of the MOSFET and ramping down the voltage applied to the gate of the MOSFET based on the gate control circuit turning off power to the gate of the MOSFET.

8 Claims, 5 Drawing Sheets

(56) References Cited

U.S. PATENT DOCUMENTS

2013/0049465 A1 2/2013 Rozman et al.
2013/0063189 A1* 3/2013 Brumett et al. ............... 327/109
2013/0221941 A1 8/2013 Rozman et al.

OTHER PUBLICATIONS

European Search Report for Application No. 14167095.0-1805. Mailed on Sep. 3, 2014, 6 pages.

M.Helsper, F.W.Fuchs, "Adaptation of IGBT Switching Behavior by Means of Active Gate Drive Control for Low and Medium Power", University of Kiel, Power Electronics and Electrical Drives, Germany. Oct 16, 2003, 10 pages.

P.R. Palmer and H.S. Rajamani "Active Voltage Control of IGBTs for High Power Applications", IEEE Trans. On Power Electronics, vol. 19, No. 4, Jul. 2004, pp. 894-901.

Y.Lobsiger et al., "Closed-Loop IGBT Gate Drive Featuring Highly Dynamic di/dt and dv/dt Control", IEEE Energy Conversion Congress and Exposition (ECCE USA-2012), Raleigh, USA, Sep. 16-20, Power Electronic Systems Laboratory, Swiss Federal Institute of T.

S. Park and T. M. Jahns, "Flexible dv/dt and di/dt Control Method for Insulated Gate Power Switches", IEEE Trans. On Industry Applications, vol. 39, No. 3, May/Jun. 2003, pp. 657-664, University of Wisconsin, Madison, USA.

* cited by examiner

US 9,071,245 B2

SOLID STATE POWER CONTROLLER GATE CONTROL

BACKGROUND OF THE INVENTION

Embodiments of the invention relate to solid state power controllers (SSPCs), and in particular to controlling gates of an SSPC to provide soft turn-on and turn-off characteristics.

Solid state circuit breakers (SSCBs) are used in power distribution systems to replace traditional electromechanical circuit breakers. SSCBs distribute power and provide over-current or over-voltage protection to different loads. Compared with electromagnetic devices, SSCBs provide a fast response time and eliminate arcing during turn-off transient and bouncing during turn-on transient. SSCBs do not suffer severe degradation during repeated fault isolation in comparison with electromechanical devices. In addition, SSCBs have a smaller weight and size than traditional electromechanical circuit breakers.

The silicon carbide (SiC) metal oxide semiconductor field effect transistor (MOSFET) is used in SSCB applications due to its low conduction loss. However, during turn-off, the SiC MOSFET may cause significant electromagnetic interference (EMI) due to its high frequency ringing. The ringing is caused by the output capacitance of the SiC MOSFET resonating with the stray inductance in the high current path. There is a need to improve SSCB control to minimize EMI noise during switching and reduce overvoltage stress on SiC MOSFET during turn-off event, especially at short circuit conditions.

In addition, SSCBs used as a part of a solid state power controller (SSPC) may need to support nontraditional functions such as in-rush current limiting during channel closure into capacitive load and current limiting in the event of short circuit faulty loads.

BRIEF DESCRIPTION OF THE INVENTION

Embodiments of the present invention include a system for controlling gate power. The system includes a metal oxide semiconductor field effect transistor (MOSFET) configured to supply power to a load according to a gate control voltage applied to a gate of the MOSFET. The system includes a gate control circuit configured to turn on and off the gate control voltage supplied to the gate of the MOSFET. The system also includes a ramping circuit configured to perform at least one of ramping up a voltage applied to the gate of the MOSFET based on the gate control circuit turning on power to the gate of the MOSFET and ramping down the voltage applied to the gate of the MOSFET based on the gate control circuit turning off power to the gate of the MOSFET.

Embodiments of the invention further include a method including controlling a gate drive circuit to provide power to a gate of a metal oxide semiconductor field effect transistor (MOSFET), where the MOSFET is configured to control the supply of power to a load. The method also includes controlling the power supplied to the gate of the MOSFET from the gate drive circuit to ramp the voltage level over time to the gate of the MOSFET.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Solid-state power controller (SSPC) systems utilizing MOSFETs to turn on and off power to a load may experience over-voltages or over-currents that may cause damage to the MOSFET. Embodiments of the invention relate to systems, circuits and methods for ramping up and ramping down power to a gate of a MOSFET that controls the supply of power to a load.

Figure 1:
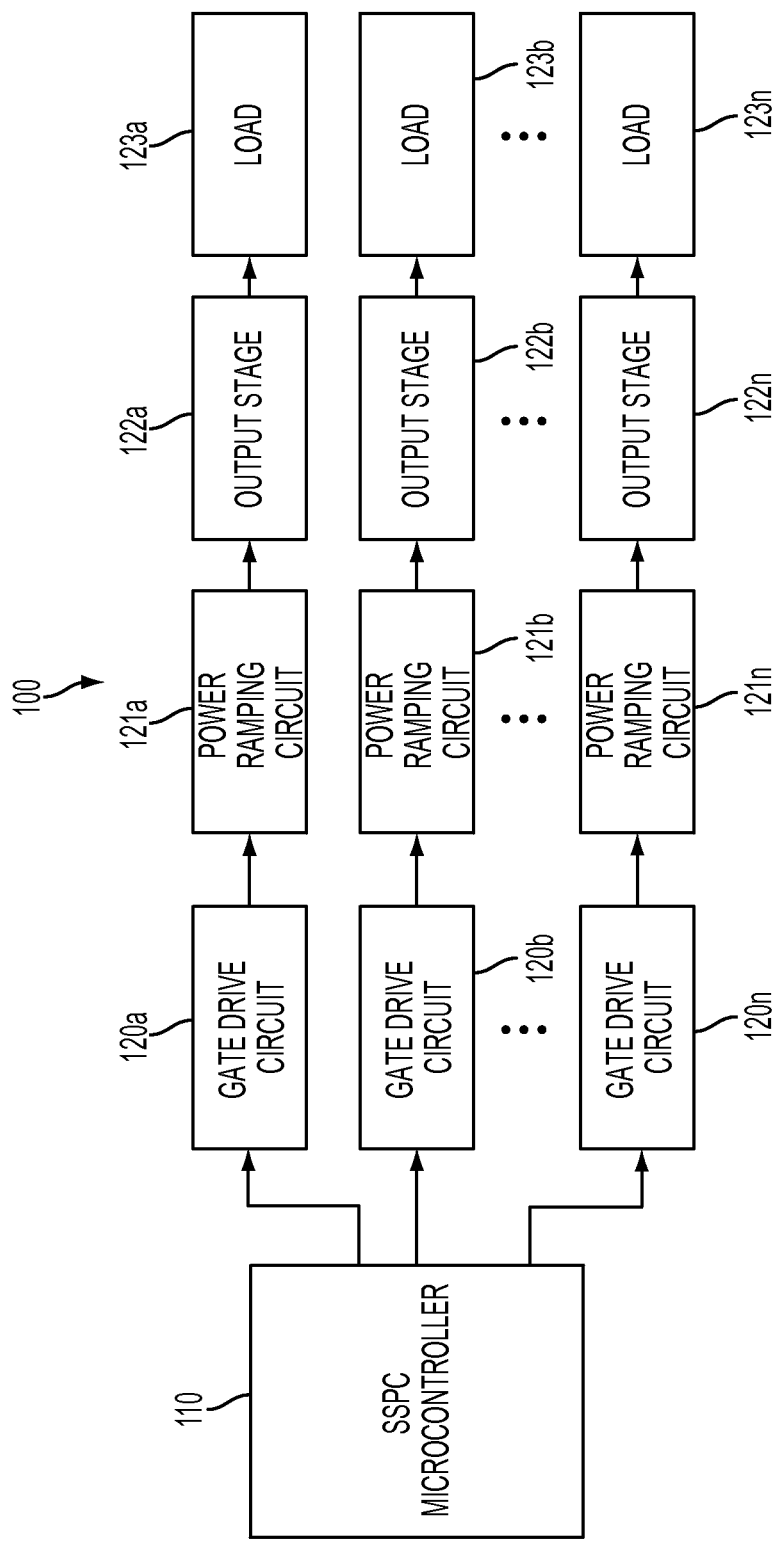
FIG. 1 illustrates a block diagram of an electrical system according to an embodiment of the invention.

FIG. 1 illustrates a block diagram of an electrical system 100 according to an embodiment of the invention. The system 100 includes a solid-state power controller (SSPC) microprocessor 110, gate drive circuits 120a to 120n, power ramping circuits 121a to 121n and loads 123a to 123n, where "n" represents any integer greater than one. In operation, the SSPC controller 110 controls one or more of the gate drive circuits 120a to 120n to control output power stages 122a to 122n to provide power to the loads 123a to 123n. The output power stages 122a to 122n may include a single or multiple parallel connected MOSFETs, overvoltage protection diodes to prevent overvoltage condition at the load during output power stage turn-off, a current limiting inductor and an output current sensor. The power ramping circuits 121a to 121n are positioned electrically between the gate drive circuits 120a to 120n and the output power stages 122a to 122n or between components of the gate drive circuits 120a to 120n. For example, in an embodiment in which the gate drive circuits 120a to 120n include pulse transformers to provide gate power to a metal oxide semiconductor field effect transistor (MOSFET), the power ramping circuit may be provided between the pulse transformers and the MOSFET. The power ramping circuits 121a to 121n ramp up and ramp down power to the loads 123a to 123n during turn-on and turn-off operations. In addition, the power ramping circuits 121a to 121n limit one or both of a current or a voltage provided to the loads 123a to 123n or to electrical components of the gate drive circuit 120a to 120n. In the present specification and claims, the terms "ramping," "ramping up" and "ramping down" refer to changing a rate at which power supplied to the gate of MOSFET changes from a low voltage to a high voltage (ramping-up) or from a high voltage to a low voltage (ramping-down) relative to a gate drive power output signal from a gate drive circuit.

Figure 2:
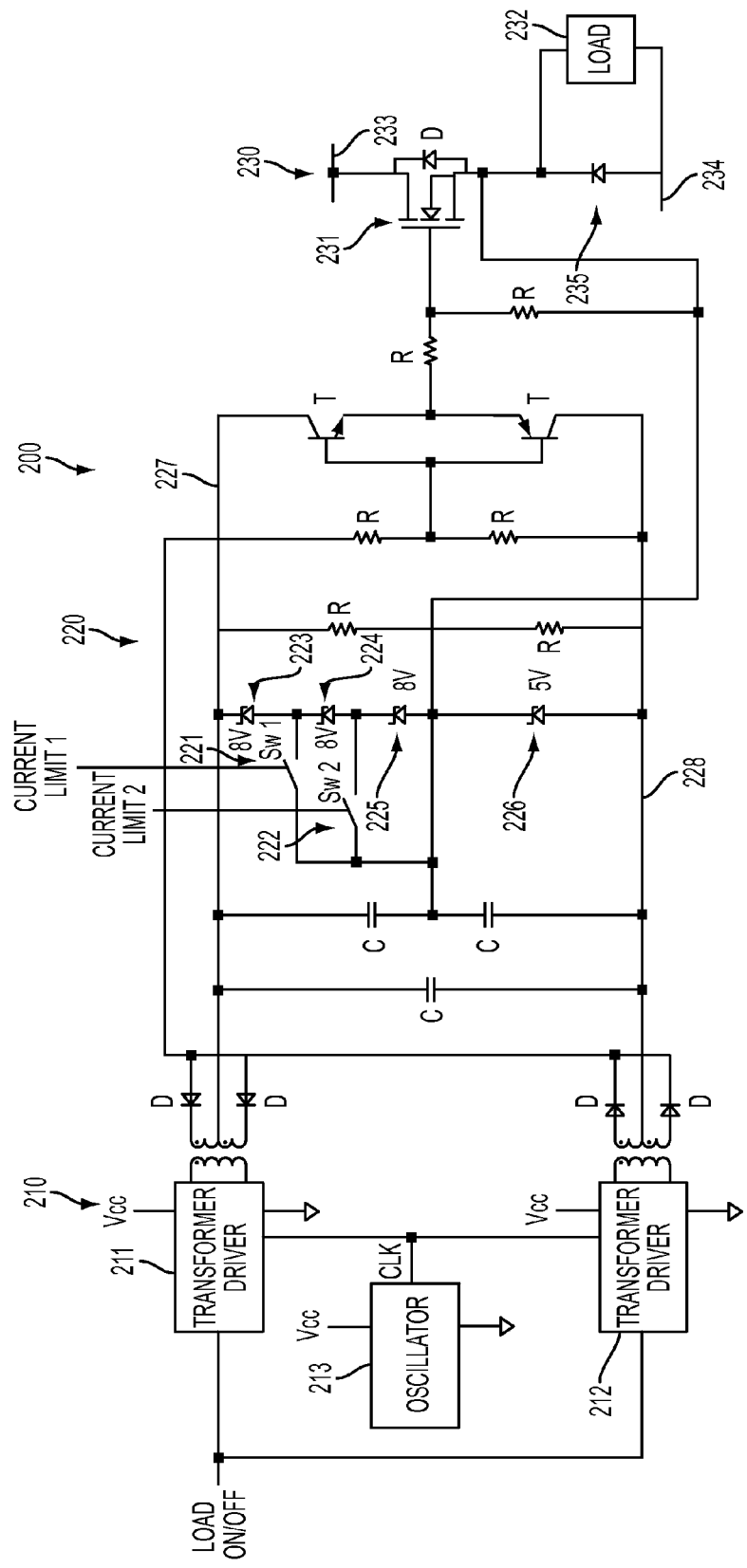
FIG. 2 illustrates an electrical circuit according to an embodiment of the invention.

FIG. 2 illustrates an example of an electrical circuit 200 for supplying power to a load via a solid-state power controller (SSPC) according to an embodiment of the invention. The electrical circuit 200 includes an input power stage 210, a ramping stage 220 and an output power stage 230. The power input stage 210 includes pulse transformers 211 and 212 to pass power through the ramping stage 220, to control power supplied to the output power stage 230 and to achieve galvanic isolation. The power input stage 210 also includes an oscillator 213 to generate a clock signal CLK. The ramping stage 220 includes switches 221 and 222, resistor divider, and Zener diodes 223 to 226 to output gate voltages of varying levels. The output power stage 230 includes a MOSFET 231 to control voltage supplied to a load 232 from a high voltage positive rail 233 and a high voltage negative rail 234, and an overvoltage protection diode 235. In one embodiment, the MOSFET 231 is a silicon carbide SiC MOSFET. The output power stage 230 is powered by positive and negative rails. A negative rail voltage is set by a resistive voltage divider. A positive rail voltage is controlled by a plurality of Zener diodes 223, 224, 225 and 226 connected in parallel with the analog switches 221 and 222. Zener diodes are used to produce a stabilized voltage output with low ripple under varying load current conditions. By passing a small current through the diode from a voltage source, via a current limiting resistor (located within the transformer drivers 211, and 212), the Zener diode will conduct sufficient current to maintain a stable output voltage.

As illustrated in FIG. 2, the gate driver circuit 200 includes additional circuitry including diodes D, resistors R, capacitors C and transistors T. While these various electrical components contribute to the functionality of the circuit, their general characteristics and operation are known in the electrical field and are therefore omitted from the present detailed description.

The power input stage 210 includes a load on/off input, which controls the pulse transformers drivers 211 and 212 to supply power to the ramping stage 220 and the MOSFET 231. The outputs from the pulse transformers drivers 211 and 212 supply power to a positive voltage rail 227 and a negative voltage rail 228 of the ramping stage 220. For purposes of description, the positive voltage rail 227 will be described as having a potential voltage of up to +24V and the negative voltage rail 228 will be described as being held at −5V. However, embodiments of the invention encompass any positive and negative rail voltages, which may be adjusted according to the components in the circuit, such as the switches 221 and 222 and the MOSFET 231.

In FIG. 2, the negative rail voltage is set to −5V by resistive voltage divider. The Zener diode 226 provides an undervoltage protection of the MOSFET gate not to exceed a predetermined voltage, such as −5V. The positive rail voltage is controlled by the Zener diodes 223 to 225 connected in parallel with the analog switches 221 and 222. In the present description, the Zener diodes 223 to 225 are described as having breakdown voltages of 8V each. However, embodiments of the invention encompass Zener diodes having any breakdown voltages. Two analog switches 221 and 222 are shown in FIG. 2 to provide three levels of positive gate voltages: +8V, +16V, and +24V based on the current flow through the respective Zener diodes 223 to 225. However, embodiments of the invention encompass any number of analog switches. For example, a 2-level control may be accomplished with a single analog switch to provide +8V, and +24V.

In one embodiment, the analog switches 221 and 222 are controlled via an opto-isolated interface to a microcontroller, which is not shown in FIG. 2. A gate drive output line is connected to the gate and the auxiliary source of the MOSFET 231. A voltage-clamping diode 235 is shown across the load 232 to reduce over-voltage stress during switch turn-off, due to parasitic or intentional line inductances.

In operation, the switches 221 and 222 are controlled to limit in-rush current caused by a capacitive load, or by a short circuit of a faulty load. To control such an in-rush current, the analog switches 221 and 222 are turned on during initial start-up. When both analog switches 221 and 222 are turned on, the positive voltage rail 227 is maintained at a voltage of +8V by the Zener diodes 223 to 225. Accordingly, the gate-source voltage of the MOSFET 231 is reduced relative to a higher-voltage gate voltage, such as +16V or +24V, and current to the load is limited. It may be determined by a microcontroller whether the load current exceeds its pre-determined limit or threshold level. If the load current does not exceed the predetermined threshold level, then the analog switches 221 and 222 are sequentially turned off, to sequentially provide to the MOSFET 231 voltages of +16V (with only one analog switch 221 or 222 turned off) and +24V (with both analog switches 221 and 222 turned off).

On the other hand, if it is determined that the load current exceeds its predetermined threshold, then the analog switches 221 and 222 may remain closed, and the gate drive circuit 200 may be turned off with the Load On/Off signal to the pulse transformers drivers 211 and 222. By cycling the Load On/Off signal several times and observing the load current, a decision can be made whether the load 232 is of a capacitive nature or a short circuited faulty load. If the load current is reduced after several turn-on cycles, then it is determined that the load 232 is capacitive. If the load current is not reduced, then it is determined that the load 232 is faulty. If the load 232 is faulty, an SSPC microcontroller may disable the channel (or the gate drive circuit 200) and may provide an indicator such as an electronic signal or message to indicate that the load is short-circuited. On the other hand, if the load 232 is capacitive, the SSPC microcontroller may continue power cycling until current is reduced to enable the MOSFET 231 to be fully turned-on. A combination of load voltage and current can be used to determine when the capacitive load is precharged.

In another operation, the gate drive circuit 200 may perform a soft turn-off by sequentially turning on the analog switches 221 and 222. Accordingly, the voltage supplied to the MOSFET 231 may sequentially change from +24V to +16V to +8V. The gate drive circuit 200 may then be turned off by the Load On/Off signal to the pulse transformers drivers 211 and 222 supplying −5V to the MOSFET 231 gate. In such an operation, the load current is gradually reduced, electromagnetic interference (EMI) is reduced, and voltage stress across the MOSFET 231 is reduced.

Figure 3:
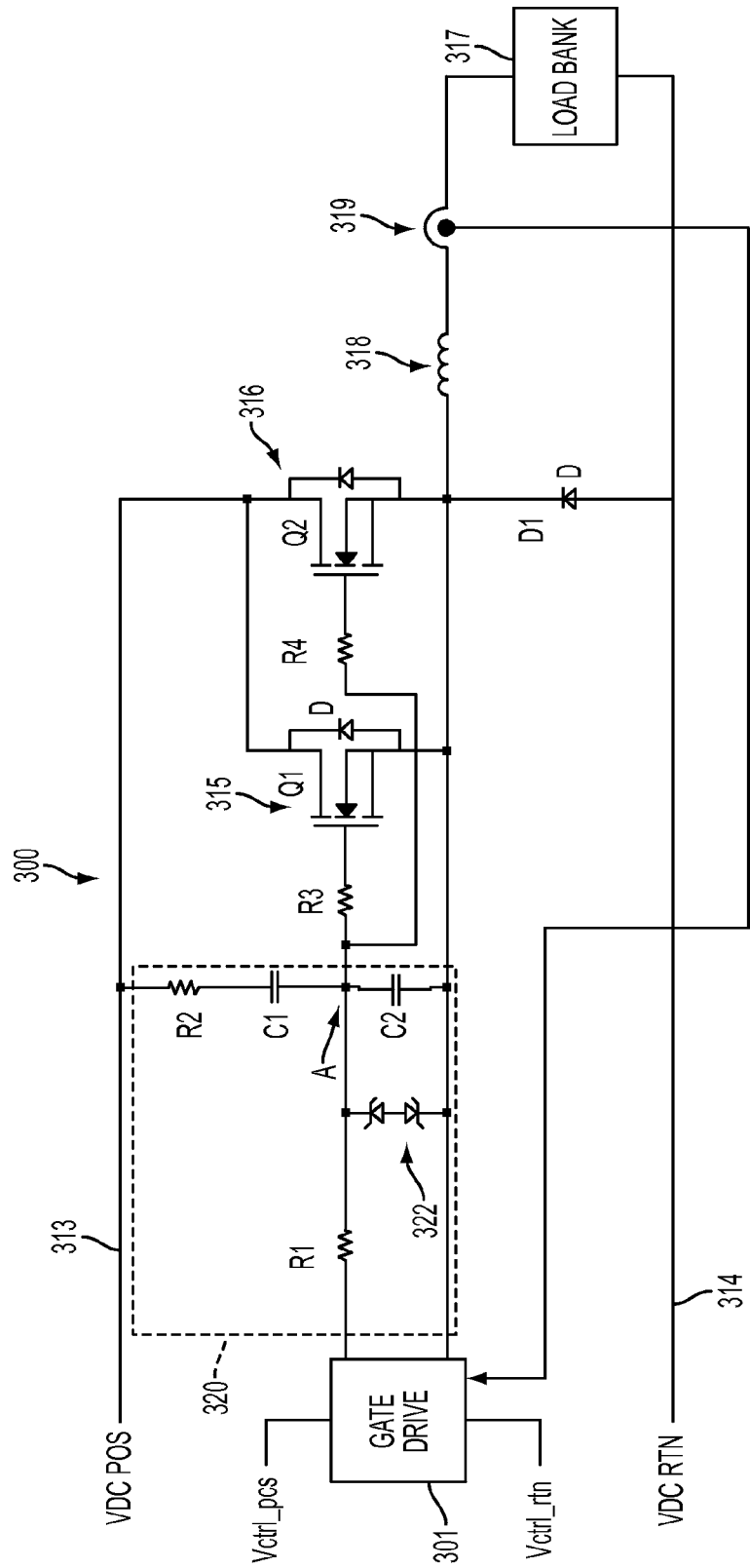
FIG. 3 illustrates an electrical circuit according to another embodiment of the invention.

FIG. 3 illustrates an electrical circuit 300 according to another embodiment of the invention. A gate drive 301 utilizes pulse transformers, such as the pulse transformers and transformer drivers 211 and 212 illustrated in FIG. 2, to pass both power and control to achieve galvanic isolation. The gate drive control circuit 300 includes high voltage positive and negative rails 313 and 314, ramping circuitry 320, MOSFETs 315 and 316 and a load 317. The power ramping is accomplished by a resistor-capacitor (RC) network connected between a drain of MOSFETs 315 and 316 and a common gate control point A. The RC network includes resistors R1 and R2 and capacitors C1 and C2. The gate of each MOSFET 315 and 316 is connected to common point A via decoupling gate resistors R3 and R4. A capacitor C2 and clamping Zener diodes 322 are connected between the sources of the MOSFETs 315 and 316 and the common point A. The gate drive 301 output is connected to the common point A via a resistor R1. The load current ramping, or change in current over time (dI/dt) is limited by an output inductor 318.

In operation, the gate drive 301 is turned on to provide power to the MOSFETs 315 and 316. The MOSFETs 315 and 316 provide power from the high-voltage positive and negative rails 313 and 314 to the load 317. The power ramping circuit 320 reduces overvoltage stress and ringing of the MOSFETs 315 and 316 and electromagnetic interference noise.

Figure 4:
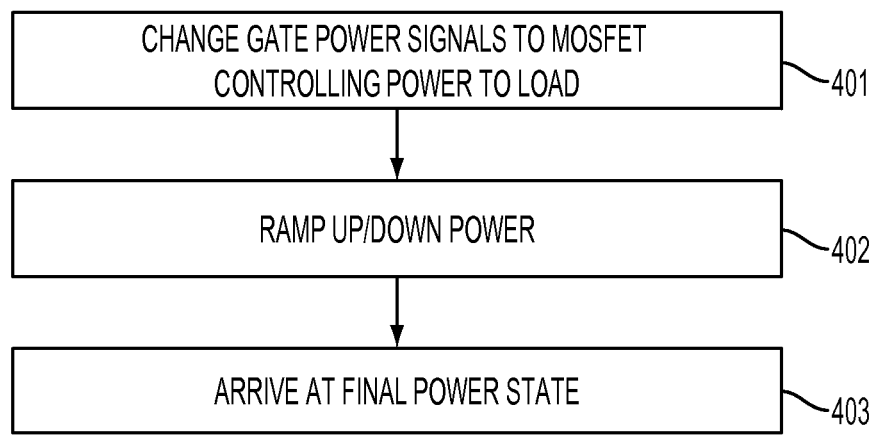
FIG. 4 is a flow diagram illustrating a method according to an embodiment of the invention.

FIG. 4 illustrates a method according to an embodiment of the invention. In block 401, a gate power signal to control power to a load is changed, either from on to off, or from off to on. In block 402, the power to the gate of a MOSFET that controls the supply of power to the load is ramped up, in the case of turning on the power to the load, or ramped down, in the case of turning off power to the load. The ramping up or ramping down of power may include one or more switches controlled by control signals, or it may include only passive electrical components requiring to additional commands than the initial command to change the power supplied to the load. For example, the ramping up or ramping down may be achieved by an RC circuit arranged in electrical communication with the MOSFET that supplies power to the load. In addition, the circuit that ramps up or ramps down the power may also provide a voltage or current limit of power supplied to the gate of the MOSFET. In block 403, the final gate power level is supplied to the gate of the MOSFET.

Figure 5:
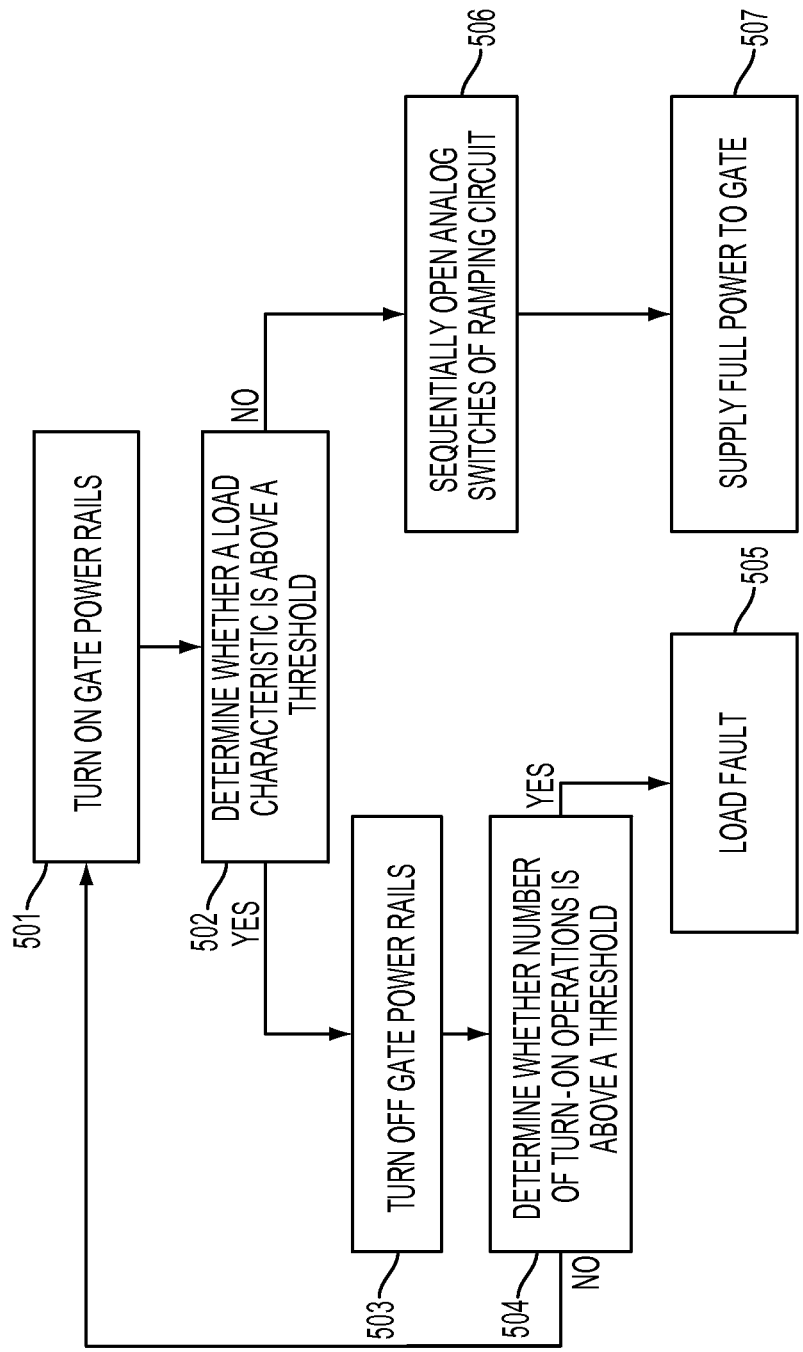
FIG. 5 is a flow diagram illustrating a method according to an embodiment of the invention.

FIG. 5 illustrates one example of a method to provide gate power signals to a MOSFET controlling power to a load. In block 501, power to the rails of a gate power circuit is turned on. In one embodiment, a microcontroller controls one or more transformer drive circuits to turn on two pulse transformers to supply the power to the positive gate voltage rail and the negative gate voltage rail. In block 502, it is determined whether a load characteristic, such as load current, is above a threshold level. If so, then in block 503 the power is turned off to the gate voltage power rails. In block 504, it is determined whether the number of turn-on operations, or turn-on/turn-off cycles, is above a threshold number. If so, then in block 505, it is determined that the load has a fault, such as a short circuit, and the process of turning on the power to the gate power rails is ended. In one embodiment, the microcontroller generates an error signal or shuts off access to the channel including the faulty load.

If it is determined in block 504 that the number of turn-on operations is not above the threshold, then the power is again turned on to the power rails in block 501 and the power characteristic is again detected in block 502. If it is determined in block 502 that load characteristic (such load current) is not above the threshold, then one or more switches are opened in block 506 to provide sequential gate voltage and/or current levels to the gate of a MOSFET controlling power to the load. In one embodiment of the invention, the one or more switches are connected between ends of Zener diodes, such that when the switches are incrementally opened or turned off, the voltage level applied to the gate of the MOSFET providing power to the load incrementally increases according to the breakdown voltages of the Zener diodes. After sequentially opening the analog switches, a full power level is supplied to the gate of the MOSFET in block 507.

While two examples of gate drive systems and circuits have been provided for purposes of description, embodiments of the invention encompass any system or circuit that controls the voltage or current supplied to the gate of a MOSFET supplying power to a load to have a ramped voltage or current when the power to the gate is turned on. In addition, embodiments encompass ramping circuits that limit voltage or current to the gate of the MOSFET. In addition, while a few examples of methods for ramping power to a gate of a MOSFET have been described, embodiments of the invention encompass any method of ramping up and down power to a gate of a MOSFET in a circuit in which the MOSFET controls power supplied to a load.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A system for controlling gate power, comprising:
a metal oxide semiconductor field effect transistor (MOSFET) configured to supply power to a load according to a gate control voltage applied to a gate of the MOSFET;
a gate control circuit configured to turn on and off the gate control voltage supplied to the gate of the MOSFET;
a ramping circuit configured to perform at least one of ramping up a voltage applied to the gate of the MOSFET based on the gate control circuit turning on power to the gate of the MOSFET and ramping down the voltage applied to the gate of the MOSFET based on the gate control circuit turning off power to the gate of the MOSFET; and
wherein the gate control circuit includes a first pulse transformer to provide power to a positive voltage gate rail and a second pulse transformer to provide power to a negative voltage gate rail.

2. The system of claim 1, wherein the MOSFET is a silicon carbide (SiC) MOSFET.

3. A system for controlling gate power, comprising:
a metal oxide semiconductor field effect transistor (MOSFET) configured to supply power to a load according to a gate control voltage applied to a gate of the MOSFET;
a gate control circuit configured to turn on and off the gate control voltage supplied to the gate of the MOSFET;
a ramping circuit configured to perform at least one of ramping up a voltage applied to the gate of the MOSFET based on the gate control circuit turning on power to the gate of the MOSFET and ramping down the voltage applied to the gate of the MOSFET based on the gate control circuit turning off power to the gate of the MOSFET;
wherein the ramping circuit comprises:
a resistive voltage divider to provide a predetermined negative voltage;
a first Zener diode configure to protect the gate of the MOSFET from excessive negative voltage;
at least one second and at least one third Zener diode arranged in series between the negative voltage gate rail and a positive voltage gate rail; and
at least one switch having one end connected between the at least one second and at least one third Zener diodes, such that switching the at least one switch provides an incremental change in a voltage level, less than the full gate voltage, supplied to the gate of the MOSFET.

4. A method comprising:
controlling a gate drive circuit to provide power to a gate of a metal oxide semiconductor field effect transistor (MOSFET), the MOSFET configured to control the supply of power to a load;
controlling the power supplied to the gate of the MOSFET from the gate drive circuit to ramp the voltage level over time to the gate of the MOSFET; and
wherein controlling the power supplied to the gate of the MOSFET to ramp the voltage level over time includes switching at least one analog switch having one end connected between Zener diodes, the Zener diodes connected between a positive voltage rail and a negative voltage rail.

5. The method of claim 4, wherein controlling the gate drive circuit to provide power to the gate includes providing a first voltage level to turn on the MOSFET, and switching the at least one analog switch includes providing a first voltage level, greater than a voltage of the negative voltage rail and less than a voltage of the positive rail, to the gate of the MOSFET based the at least one analog switch being turned off, and providing the voltage of the positive voltage rail to the gate of the MOSFET based on the at least one analog switch being turned on.

6. The method of claim 4, further comprising:

detecting a power characteristic of the load based on the first voltage level being provided to the gate of the MOSFET; and controlling the gate drive circuit to turn off the power to the gate of the MOSFET based on detecting the load characteristic beyond a predetermined threshold.

7. The method of claim 6, further comprising:

controlling the gate drive circuit to turn on the power to the gate of the MOSFET, after having turned off the power to the gate of the MOSFET based on detecting the load characteristic beyond the predetermined threshold, based on determining that a number of turn on/turn off cycles is less than a threshold number of cycles.

8. The method of claim 6, further comprising:

determining whether a number of turn on/turn off cycles exceeds a threshold number of cycles; and determining that the load is faulty based on determining that the number of turn on/turn off cycles exceeds the threshold number of cycles.

\* \* \* \* \*